United States Patent
Soulan (10) Patent No.: US 9,223,926 B2
(45) Date of Patent: Dec. 29, 2015

(54) METHOD FOR CORRECTING ELECTRONIC PROXIMITY EFFECTS USING THE DECONVOLUTION OF THE PATTERN TO BE EXPOSED BY MEANS OF A PROBABILISTIC METHOD

(75) Inventor: Sébastien Soulan, Villard Bonnot (FR)

(73) Assignees: Aselta Nanographics, Grenoble (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/344,671

(22) PCT Filed: Sep. 12, 2012

(86) PCT No.: PCT/EP2012/067756
§ 371 (c)(1),
(2), (4) Date: Apr. 11, 2014

(87) PCT Pub. No.: WO2013/037788
PCT Pub. Date: Mar. 21, 2013

(65) Prior Publication Data
US 2014/0344769 A1    Nov. 20, 2014

(30) Foreign Application Priority Data

Sep. 13, 2011   (FR) .................................... 11 58123
Sep. 13, 2011   (FR) .................................... 11 58130

(51) Int. Cl.
*G06F 17/50*      (2006.01)
*H01J 37/317*     (2006.01)
(Continued)

(52) U.S. Cl.
CPC ............ *G06F 17/5081* (2013.01); *B82Y 10/00* (2013.01); *B82Y 40/00* (2013.01); *G06F 17/5072* (2013.01); *H01J 37/3174* (2013.01)

(58) Field of Classification Search
CPC ................................ G06F 17/50; H01J 37/31
USPC .......................................................... 716/52
See application file for complete search history.

(56) References Cited

U.S. PATENT DOCUMENTS

2008/0067446 A1   3/2008  Belic et al.
2008/0116398 A1   5/2008  Hara et al.
(Continued)

FOREIGN PATENT DOCUMENTS

WO    2011/128348 A1   10/2011
WO    2011128391 A1    10/2011
WO    2011128393 A1    10/2011

OTHER PUBLICATIONS

M.E. Haslam, et al., "Transform Based Proximity Corrections: Experimental Results and Comparisons", J. Vac. Sci. Technology, Jan. 1986, pp. 168-175, Center for Integrated Electronics, Rensselaer Polytechnic Institute, Troy, NY, XP-002680208.
(Continued)

*Primary Examiner* — Thuan Do
(74) *Attorney, Agent, or Firm* — Baker & Hostetler LLP (57) ABSTRACT

A method of lithography by radiation having critical dimensions of the order of some ten nanometers makes it possible to carry out the correction of the proximity effects by joint optimization of the dose modulation and geometric corrections. Accordingly, a deconvolution of the pattern to be etched is carried out by an iterative procedure modeling the interactions of the radiation with the resined support by a joint probability distribution. Advantageously, when the support exposure tool is of formed-beam type, the pattern to be etched is split into contrasted levels and then the deconvolved image is vectorized and fractured before carrying out the exposure step. In an advantageous embodiment, the method is applied to at least two character cells which are exposed in a multi-pass cells projection method.

11 Claims, 11 Drawing Sheets

(51) Int. Cl.
*B82Y 10/00* (2011.01)
*B82Y 40/00* (2011.01)

(56) References Cited

U.S. PATENT DOCUMENTS

| 2010/0225913 | A1* | 9/2010 | Trainer | 356/338 |
|---|---|---|---|---|
| 2013/0181379 | A1 | 7/2013 | Manakli | |
| 2013/0201467 | A1 | 8/2013 | Manakli | |
| 2013/0201468 | A1 | 8/2013 | Manakli | |

OTHER PUBLICATIONS

Hans Eisenmann, et al., "PROXECCO—Proximity Effect Correction by Convolution", J. Vac. Sci. Technology, Nov. 1, 1993, pp. 2741-2745, vol. 11, No. 6, American Vacuum Society, New York, New York, USA, XP002612755.

L. Martin, et al., "New Writing Strategy in Electron Beam Direct Write Lithography to Improve Critical Dense Lines Patterning for Sub-45nm Nodes", Proceedings of SPIE, Jan. 12, 2009, pp. 1-12, vol. 7470, SPIE, USA, XP002657640.

Serdar Manakli, et al., Complementary Dose and Geometrical Solutions for Electron Beam Direct Write Lithography Proximity Effects Correction: Application for Sub-45-nm Node Product Manufacturing, Journal of Micro-Nanolithogrpahy, MEMS and MOEMS, Dec. 1, 2007, pp. 33001-1 thru 33001-7, vol. 6, No. 3, SPIE International Society of Optical Engineering, USA, XP-002633889.

William Hadley Richardson, "Bayesian-based Iterative Method of Image Restoration", Journal of the Optical Society of America, Jan. 1, 1972, pp. 55-59, vol. 62, No. 1, American Institute of Physics, New York, USA, XP-00251397.

Peter Selinger, "Potrace: A Polygon-Based Tracing Algorithm", http://potrace.sorceforge.net/potrace.pdf, Sep. 20, 2013, pp. 1-16.

L. Martin et al., "Multiple Pass Exposure in E-Beam Lithography—Application to the Sub-22nm nodes", Proc. SPIE, Apr. 2010, vol. 7637, 11 pages.

S. Manakli et al., "Cell Projection Use in Mask-Less Lithography for 45nm & 32nm Logic Nodes", Proc. of SPIE, 2009, vol. 7271, 9 pages.

H. Sewell, "Control of Pattern Demensions oin Electron Lithography", J. Vac. Sci. Technol., 1978, vol. 15, No. 3, pp. 927-930.

Cook, "Dose, Shape, and Hybrid Modifications for PYRAMID in Electron Beam Proximity Effect Correction", J. Vac. Sci.Techol. B., Nov./Dec. 1997, vol. 15, No. 6, pp. 2303-2308.

* cited by examiner

FIG.9a (An embodiment of the invention)
FIG.10b (Prior art)
FIG.10a

METHOD FOR CORRECTING ELECTRONIC PROXIMITY EFFECTS USING THE DECONVOLUTION OF THE PATTERN TO BE EXPOSED BY MEANS OF A PROBABILISTIC METHOD

CROSS-REFERENCE TO RELATED APPLICATIONS

This application is a National Stage of International patent application PCT/EP2012/067756, filed on Sep. 12, 2012, which claims priority to foreign French patent application No. FR 1158123, filed on Sep. 13, 2011 and to foreign French patent application No. FR 1158130, filed on Sep. 13, 2011, the disclosures of which are incorporated by reference in their entirety.

The present invention applies notably to the field of electron lithography for the direct on-wafer etching or for the fabrication of masks. At the critical dimensions of less than 22 nm achieved by production technologies, the interaction of the electron beam with the target is notably affected by a scattering of the electrons around the initial trajectory (forward scattering effect) as well as by a backscattering effect. These effects, termed proximity effects, depend notably on the materials of the target and its geometry. It is therefore necessary to take account of the proximity effects in order to obtain etched patterns that are faithful to the defined template. Accordingly, it is known to apply two procedures, in general in an independent manner. On the one hand, the proximity effects are modeled to modulate the electron radiation doses used to bombard the target. Moreover, the source template is modified as a function of design rules devised in a more or less empirical way so that the target template is in accordance with the objective sought.

As regards dose modulation, the reference prior art is constituted by the publication by Eisennmann ("*Proxecco—Proximity Effect Correction by Convolution*"—H. Eisennmann, T. Waas, H. Hartmann—J. Vac. Sci. Technol., vol B11, N° 6, pp 2741-2745, November-December 1993) and the software marketed under the Proxecco™ brand. The dose modulation is applied to a fractured pattern, each base element receiving a modulated dose which is generated with the help of a proximity effects model. Said model generally uses a so-called point spread function (or PSF). The PSF of Eisennmann is a pair of Gaussians, one for forward scattering and the other for backward scattering. The local doses are determined by convolving the PSF with the geometry of the target.

The latter is if appropriate corrected according to a principle analogous to those of the Optical Proximity Correction (OPC) used in optical lithography. The geometric correction to be applied is in general determined by automatic optimization of the dimensions of the shapes: a line will be for example thinned down, thickened, lengthened or constricted. A designer may also propose alternative geometries which are suggested to him by his know-how. The corrections thus determined for a type of pattern make it possible to generate correction rules which are thereafter applied automatically to all the points of the chip which have the same configuration. For a detailed account of the various approaches to geometric correction, reference may be made notably to the publications by Sewell and by Cook ("*Control of Pattern Dimensions in Electron Lithography*"—H. Sewell, J. Vac. Sci. Technol., 15, 927 (1978); "*Dose, Shape and Hybrid Modifications for PYRAMID in Electron Beam Proximity Effect Correction*"—Brian D. Cook, Soo Young Lee—IEEE transactions on semiconductor manufacturing, vol. 11, N° 1, February 1998).

BACKGROUND

It is also known to decompose the exposure into several passes. The additional exposure step is then applied in general to finer geometries so as notably to improve the method resolution and window. One then speaks of eRIF (electron Resolution Improvement Feature) function or method step. Methods of this type have been described notably by Martin and Manakli ("*New writing strategy in electron beam direct write lithography to improve critical dense lines patterning for sub-45 nm nodes*"—L. Martin—EMLC 2009; international patent application No. PCT/EP2011/055746 with the title "Procédé de lithographie électronique avec correction des arrondissements de coins" [Method of electron lithography with correction of the roundings of corners], of which S. Manakli is the inventor and whose proprietor is one of the co-applicants of the present patent application.

The separate computation of the parameters of these various methods leads however to a solution which is sub-optimal both as regards design time and as regards exposure time. Solutions with joint computation of the dose modulation and geometric correction parameters have already been proposed. One avenue is that proposed by international patent application No. PCT/EP2011/055863 with the title "Procédé de lithographie à optimisation combinée de l'énergie rayonnée et de la géométrie de dessin" [Method of lithography with combined optimization of the radiated energy and of the design geometry], of which S. Manakli is the inventor and whose proprietor is one of the co-applicants of the present patent application. According to this method, the energy radiated in a dose applied to a zone and the dimensions of the pattern to be etched on this zone are computed in combination by way of the energy latitude of the method. This method works well for simple patterns such as cells with large mesh size, for the ends of lines and corners, notably. It is less effective for more complex patterns. Another avenue for jointly optimizing the radiated dose and projected geometry parameters consists in minimizing the discrepancy between the result of convolving a radiated dose with the PSF and the target pattern. Accordingly, the suggestion has been made of deconvolving the pattern to be etched by an appropriate procedure. The use of inverse Fourier transforms in combination with a two-Gaussian conventional PSF such as proposed by Eisennmann (reference cited hereinabove) has been advocated by Haslam ("*Transform based proximity corrections: Experimental results and comparisons*"—M. E. Haslam, J. F. McDonald, Center for Integrated Electronics, Rensselaer Polytechnic Institute, Troy, N.Y.—J. Vac. Sci. Technol. B4(1), January/February 1986). However, at the dimensions relevant for the technologies currently in production or under development (critical dimension of one to two tens of nanometers), this procedure is no longer suitable because of the cutoff, inherent to the inversion, that it carries out of the high spatial frequencies, which prevents sufficiently precise account being taken of the forward scattering effects which dominate at these distances.

SUMMARY OF THE INVENTION

The invention solves this problem by proposing to combine a PSF of a particular type with a deconvolution of the pattern to be etched using an iterative procedure of probabilistic type.

Advantageously, the invention can be implemented within the framework of a method of projection lithography of cells which permits a faster rate of exposure. With this aim, the method for correcting the proximity effects is combined by the probabilistic iterative procedure of the invention with a method for projecting cells at several levels of exposure which allows fine correction of the proximity effects.

For this purpose, the invention envisages a method of lithography by radiation of at least one pattern to be irradiated on a resined support comprising at least one step of generating a chosen point spread function for said radiation and a step of applying a chosen deconvolution procedure to said pattern to be irradiated by said point spread function, said method being characterized in that said point spread function is chosen so as to model only the effects of forward scattering of said radiation and in that said deconvolution procedure is chosen from among the procedures modeling the interactions of said radiation with the resined support by a joint probability distribution of said interactions.

Advantageously, said deconvolution procedure comprises a step of computing a maximum likelihood of each source point of said radiation for all the image points of the pattern to be irradiated, each image point being multiplied by the value of the point spread function between the source point and the image point.

Advantageously, said deconvolution procedure is a Lucy-Richardson procedure.

Advantageously, the method of lithography of the invention furthermore comprises a step of dithering the deconvolved image of the pattern to be irradiated.

Advantageously, the method of lithography of the invention furthermore comprises a step of splitting the deconvolved image into at least two distinct exposure levels.

Advantageously, the at least two distinct exposure levels are chosen so as to maximize the population in terms of pixels of each of the levels.

Advantageously, the method of lithography of the invention furthermore comprises a step of vectorizing the deconvolved image of the pattern to be irradiated.

Advantageously, the point spread function is a Gaussian.

Advantageously, the mid-height width of the Gaussian is between 3 nm and 15 nm.

In several embodiments of the invention, a method of lithography is implemented by projection of at least one block onto a resined substrate comprising a step of decomposing said block into cells of the template to be projected onto said substrate and at least one step of forming said cells of the template by a radiating source, said method being characterized in that it furthermore comprises for at least some of the cells of the template, at least one step of extracting at least two character cells per cell of the template, each character cell being exposed in the course of a step of forming an exposure level specific to this character cell.

Advantageously, the at least two character cells are chosen so as to maximize the population in terms of pixels of each of the N levels, N being equal to or greater than 2.

Advantageously, these embodiments furthermore comprise a dose modulation step, said modulation applying to the N character cells.

To implement the method, the invention also envisages a computer program comprising program code instructions allowing the execution of the method of lithography by radiation of the invention when the program is executed on a computer, said program comprising a function for generating a chosen point spread function for said radiation and a module for applying a chosen deconvolution procedure to the optionally filtered outputs of said radiation points spreading function applied to said pattern to be irradiated, said program being characterized in that said point spread function is chosen so as to model only the effects of forward scattering of said radiation and in that said deconvolution procedure is chosen from among the procedures modeling the interactions of the points of said radiation by a joint probability distribution of said interactions.

In several embodiments, the invention also envisages a computer program comprising program code instructions allowing, when the program is executed on a computer, the execution of the method of projection lithography of at least one block onto a resined substrate, said program comprising a module for decomposing said block into cells of the template to be projected onto said substrate and a module for forming said cells of the template by a radiating source, said program being characterized in that it furthermore comprises, as input of the decomposition module, a module configured to extract from at least some of the cells of the template at least two character cells per cell of the template, each character cell being exposed by an application of said forming module to an exposure level specific to this character cell.

Advantageously, the computer program of the invention furthermore comprises an interface window in which an operator can programme the application to at least one second pattern belonging to a determined class of correction rules determined by deconvolution of a first pattern belonging to said class.

The invention is particularly advantageous since it makes it possible to arrive in a completely automatic manner at an optimal radiated image. The limitations of the method now depend only on the limitations of the lithography machine and the arbitrations to be performed to favor the overall efficiency of the method. This level of result would not have been achievable previously, for the types of complex patterns which can thus be processed, except at the price of a dose modulation of very high precision and of very sophisticated geometric corrections requiring lengthy fine-tuning.

Furthermore, the method of the invention generates a deconvolved image as gray levels which will be able to undergo different processings depending on whether a dot-matrix exposure machine or a formed-beam projection machine (of Variable Shaped Beam or VSB type) is used.

In this second case, it is moreover possible to automatically generate eRIFs which will make it possible to improve the resolution and the writing speed, thereby constituting an additional advantage.

Furthermore, in an embodiment of the invention in combination with a multi-pass cells projection method, several groups of openings can be generated automatically on a stencil (or group of character cells) at the output of a step of deconvolving the pattern to be irradiated having generated the optimal solution from the standpoints of the dose modulation and of the source template, each group of openings corresponding to an exposure level. The dose modulation will then be performed on as many parameters as levels and will be carried out inside a cell. Thus, in this embodiment, the method of the invention makes it possible to carry out by projection of cells the irradiation of more complex patterns than the methods of the prior art, and with lower critical dimensions.

BRIEF DESCRIPTION OF THE DRAWINGS

The invention will be better understood, its various characteristics and advantages will emerge from the description which follows of several exemplary embodiments and its appended figures in which.

DETAILED DESCRIPTION

Figure 1:
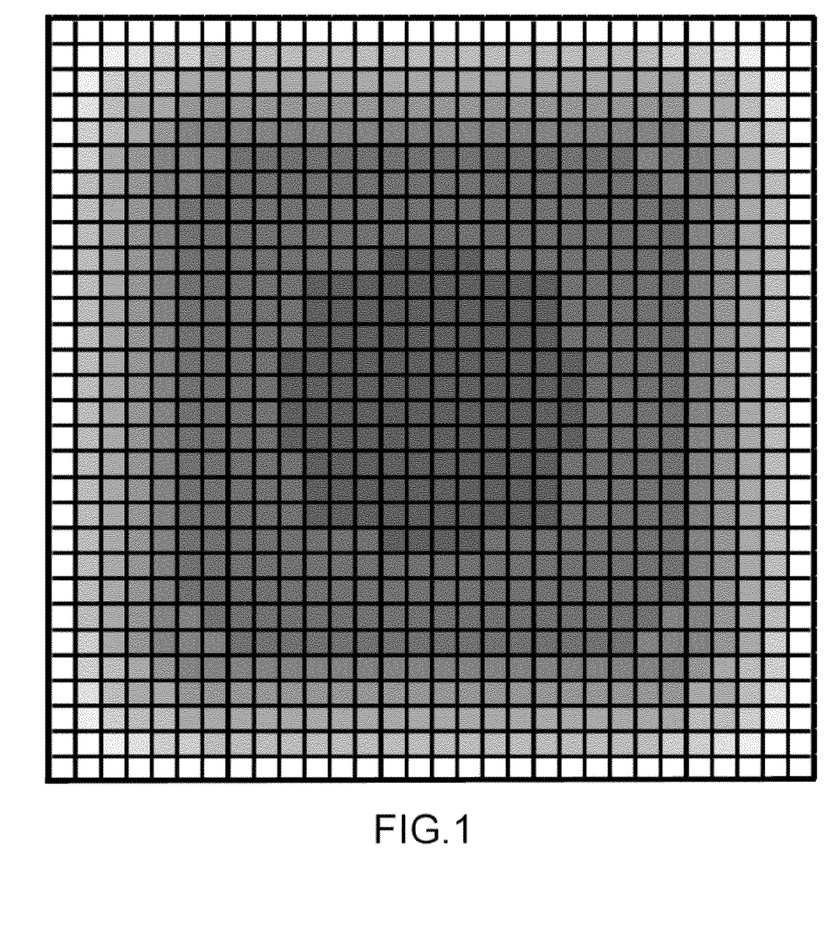
FIG. 1 illustrates the application of modulated doses according to the prior art.

FIG. 1 illustrates the application of modulated doses according to the prior art.

It is noted that the exposure is corrected as a function of the position of the patterns. The doses received are higher at the die boundary than at the center. Indeed, the patterns situated in the interior receive in proportion backscattered electrons originating from the contiguous zones more numerous than the zones situated at the boundary.

According to Eisennmann (reference cited hereinabove), these modulations of doses are computed with the help of the following double-Gaussian PSF f(x, y):

$$f(\xi) = \frac{1}{\pi(1+\eta)} \left( \frac{1}{\alpha^2} e^{\frac{-\xi^2}{\alpha^2}} + \frac{\eta}{\beta^2} e^{\frac{-\xi^2}{\beta^2}} \right)$$

With the notation:
  α is the width of the direct radiation;
  β is the backscattering width;
  η is the ratio of the intensities of the direct and backscattered radiations.
  ξ is the radial position of a point (x, y).
The values of the parameters α, β and η can be determined experimentally for a given method. These parameters are dependent on the acceleration voltage of the machine and the target.

According to Eisennmann, to perform the correction illustrated by FIG. 1, it suffices to process the phenomenon with high radius of action (greater than a micron) with respect to the impact points, i.e. the backward scattering effect, and it is possible to disregard the forward scattering effects which are dominant at small distance (radius of action of a smaller order of magnitude for the weak acceleration voltages (of the order of 5 kV) and two orders of magnitude for the stronger accelerations (typically 50 kV)). It is possible to perform a deconvolution of the effect of the PSF by an inverse Fourier transform:

$$p = F^{-1}\left(\frac{F(r)}{F(PSF)}\right)$$

It is necessary to carry out a truncation of the high spatial frequencies to avoid the cancellation of the denominator. These frequencies being representative of the forward scattering, this is not problematic in the application described by Eisennmann.

The resulting image r is reconstructed as the sum of a term equal to this truncated deconvolution of the high frequencies and of a term proportional to the source image p:

$$r = F^{-1}[g_{conv} \times F(p)] + C \times p$$

Thus the part of the pattern close to the center of the beam is properly reintroduced into the resulting image, but without correction.

This deconvolution procedure is not applicable when one is concerned precisely with the high spatial frequencies, this being the case in the present invention. The invention proposes a procedure making it possible to overcome this limitation.

Figure 2:
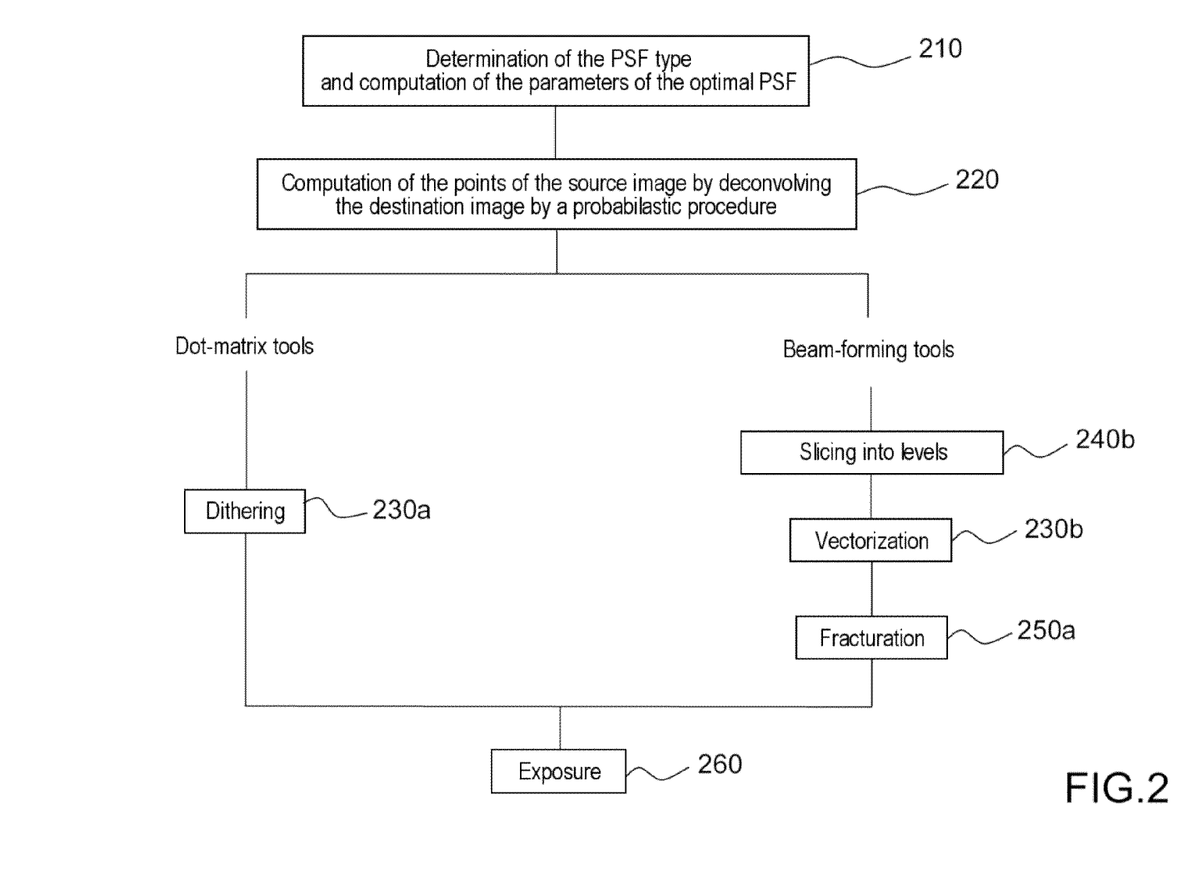
FIG. 2 represents a flowchart of the processings to be applied to implement the invention in several of its embodiments.

FIG. 2 represents a flowchart of the processings to be applied to implement the invention in several of its embodiments.

The first steps 210, 220 of the method of the invention are independent of the exposure tool used. It entails firstly choosing the type of PSF used. Since one is concerned essentially with the dominant phenomena on a scale of the order of some ten nanometers, it is not necessary for the backward scattering effect to be modeled in the PSF. A PSF which models only the forward scattering effect, which generates the crux of the proximity effects on the relevant scale, will therefore be chosen as a general rule in the course of step 210. Advantageously, the PSF will be chosen to be a Gaussian whose mid-height width is between 3 nm and 15 nm. Other functions may nonetheless be appropriate, notably symmetric functions with base width of typically between 10 nm and 50 nm.

Once the type of PSF has been chosen, it entails applying in the course of a step 220 a suitably adapted deconvolution procedure. Said procedure must at one and the same time be suited to the function to be deconvolved, be convergent and carry out this convergence in an admissible time.

Within the framework of the present invention, it is proposed to use procedures belonging to the class of probabilistic deconvolution procedures. The procedures of this type using iterations on a conditional random variable seem the most suitable. Indeed, through the scattering effect, the dose received at a point will depend on the doses radiated at all the neighboring points. It therefore entails computing at any point j the dose $p_j$ to be generated such that at a point i the effective dose received is $r_i$, it being understood that the dose $p_j$ will radiate at points other than i according to a distribution given by the PSF that can be discretized as a set of values $u_{i,j}$. It is therefore appropriate to solve the problem:

$$r_i = \sum_j u_{i,j} p_j$$

One of the procedures tested, whose convergence has been confirmed, is the algorithm of Lucy-Richardson ("*Bayesian-Based Iterative Method of Image Restoration*"—W. Hadley-Richardson, Visibility Laboratory, University of California at San Diego—Journal of the Optical Society of America, Vol. 62, N° 1, January 1972).

It is assumed that $p_j$ follows a given law (for example a Poisson's law), and, for all j, one seeks the most probable value for an $r_i$ knowing moreover $u_{i,j}$.

This amounts to solving the following recursive equation:

$$p_j^{(t+1)} = p_j^{(t)} \sum_i \frac{r_i}{c_i} u_{i,j}$$

With $$c_i = \sum_j p_{i,j} u_j^{(t)}$$

The algorithm therefore converges, although slowly. Other procedures from the same family, notably those termed "EM", for Expectation—Maximization, based on an alternation of steps of computation of mathematical expectation and of likelihood maxima, will be able to be used without departing from the scope of the invention.

The deconvolved image is obtained as gray levels, each level at each point coding the intensity of the dose to be radiated. A single operation therefore makes it possible to carry out at one and the same time the dose modulation and the geometric correction, both optimal for the pattern to be exposed. This single operation is therefore integrated instead of these two operations into the prior art data preparation methods (dataprep) embedded in off-the-shelf electron lithography tools, with no modification other than software modification. It may however also be advantageous to optimize the computation architecture in a manner suited to the deconvolution procedure chosen. A suitable computation architecture will preferably be of heterogeneous nature, that is to say containing standard processors and particular computation units, for example GPUs (Graphics Processing Units, chips initially dedicated to graphics, but which today have evolved to develop unheard-of vector computation power) or FPGAs (chips whose logic circuit is programmable: it is therefore possible to programme a chip with the efficacy optimized for a given algorithm).

It is thereafter necessary to convert this image into gray levels in a format utilizable by the type of exposure tool used (steps 230a and 230b of FIG. 2). Two main types of tool are generally used, dot-matrix tools, such as that marketed by the company Mapper and beam-forming tools, such as those marketed by the company Vistec (Vistec SB250 electron beam lithography system for example).

In the first case, the conversion is a dithering operation. In the second case, it entails a vectorization operation. These two steps will be described as commentaries respectively to FIGS. 4a, 4b and 5a, 5b.

In the case of the forming of beams, for complex patterns to be exposed, it is advantageous to interpose an operation 240 of splitting into levels allowing eRIF exposure. This operation is described in a commentary to FIGS. 6a, 6b, 6c. The pattern to be exposed is thereafter fractured into zones each corresponding to a beam (step 250).

In the two methods corresponding to the dot-matrix tool and to the beam-forming tool, the exposure step 260 can then be triggered.

Figure 3A:
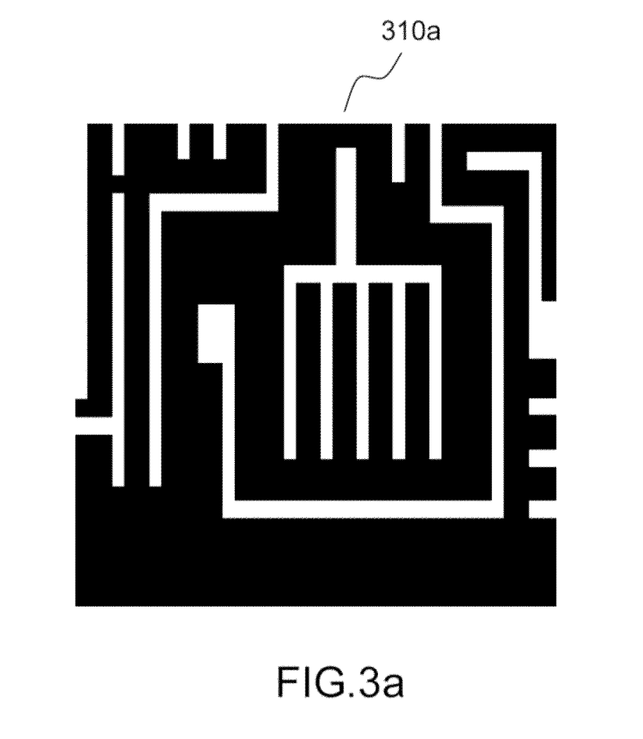
FIGS. 3a and 3b represent respectively a pattern to be exposed and its associated PSF, according to an embodiment of the invention.
Figure 3B:
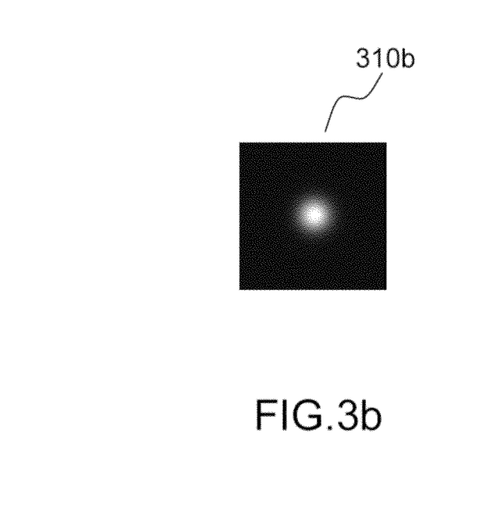

FIGS. 3a and 3b represent respectively a pattern to be exposed and its associated PSF, according to an embodiment of the invention.

FIG. 3a represents a pattern to be exposed 310a. Said pattern comprises complex structures, each having critical dimensions of the order of some ten nanometers.

FIG. 3b represents the PSF chosen 310b. As indicated, within the framework of the invention, a PSF consisting of a Gaussian function modeling the forward scattering effect, which dominates at the dimensions of interest for structures of the types of patterns considered, is advantageously chosen.

Figure 4A:
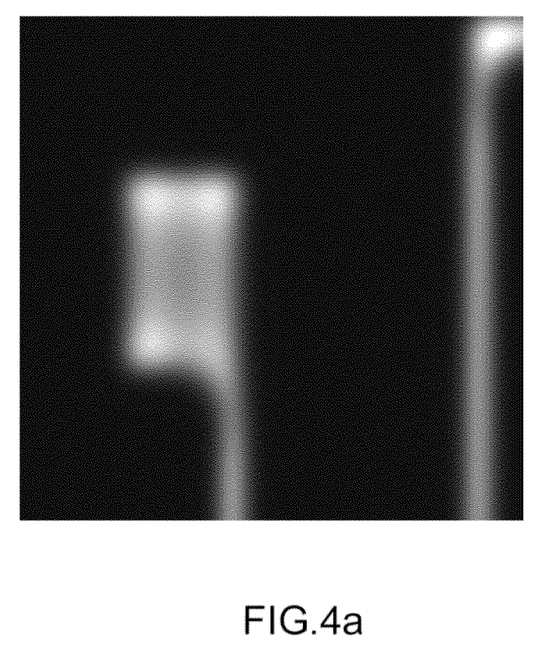
FIGS. 4a and 4b represent respectively a gray-levels image of a pattern to be exposed and its transform into a binary image by dithering, according to an embodiment of the invention.
Figure 4B:
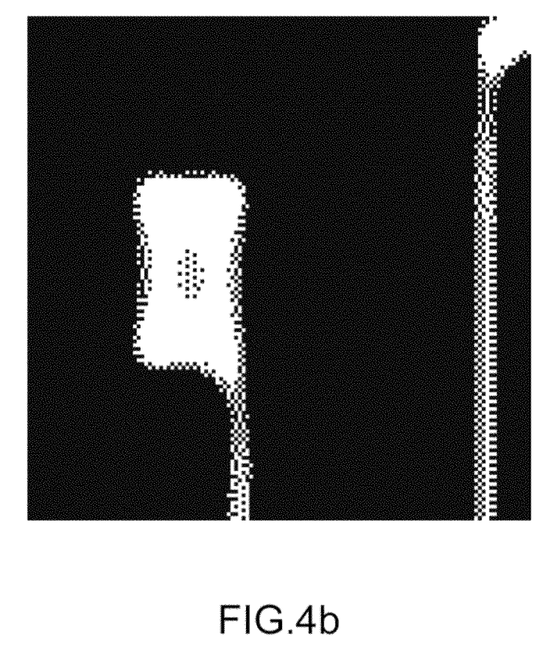

FIGS. 4a and 4b represent respectively a gray-levels image of a pattern to be exposed and its transform into a binary image by dithering, according to an embodiment of the invention.

A tool of Mapper type accepts as input a binary image (0 or 1 pixel): the switch from gray-levels image to binary image is called dithering. Numerous algorithms exist for performing this transformation, the best known being Floyd-Steinberg. This is an error diffusion algorithm. This algorithm performs dithering by diffusing the quantization error of a pixel to its neighbors. For example, a first percentage of its error chosen as a function of the number of pixels is added to the pixel to its right, a second percentage to the pixel situated at the bottom left, a third percentage to the pixel situated below and the remainder to the pixel at the bottom right. The percentages are chosen notably as a function of the number of pixels.

Figures 5A, 5B:
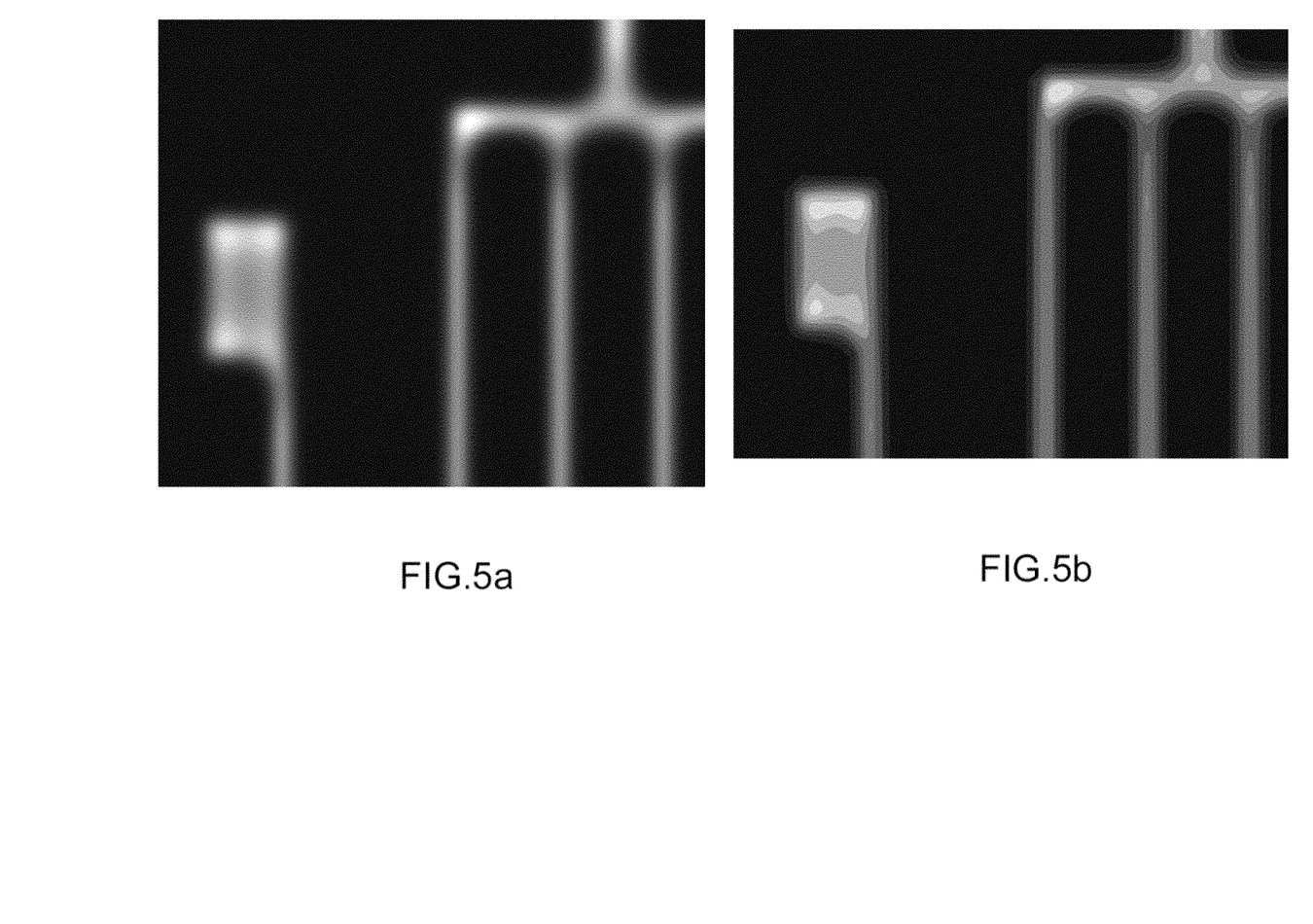
FIGS. 5a and 5b represent respectively an image in bitmap mode of a pattern to be exposed and its transform into a vector image, according to an embodiment of the invention.

FIGS. 5a and 5b represent respectively an image in bitmap mode of a pattern to be exposed and its transform into a vector image, according to an embodiment of the invention.

Vectorization is a transformation of the image as a set of points (bitmap) into a so-called vector image, which represents geometric shapes. Zones are then delimited corresponding to different doses. The gray levels of FIG. 5a are restricted and their extent is transformed into polygons. Several vectorization algorithms are usable, for example Potrace (http://potrace.sourceforge.net/, http://potrace.sourceforge.net/potrace.pdf).

Figure 6A:
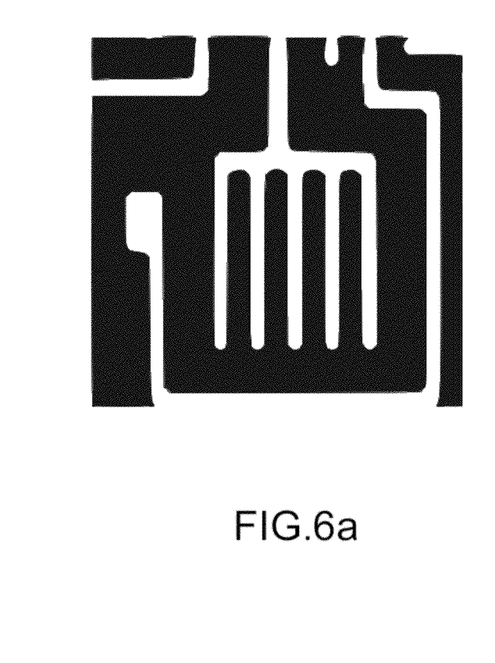
FIGS. 6a, 6b and 6c represent three different exposure levels, according to an embodiment of the invention.
Figure 6B:
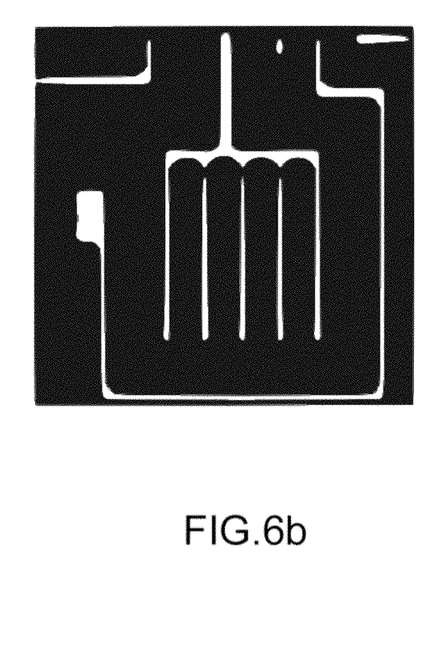
Figure 6C:
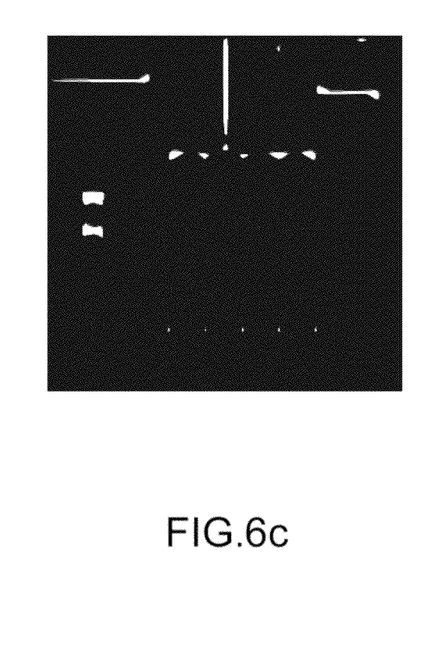

FIGS. 6a, 6b and 6c represent three different exposure levels, according to an embodiment of the invention.

It is often advantageous to carry out several exposure passes. This splitting into levels makes it possible to carry out a smaller number of shots and consequently permits a faster writing speed.

To decide the splitting into levels, it is for example advantageously possible to produce a histogram of the values taken by the pixels: the more populated a brightness level (i.e. the higher the number of pixels corresponding to this level), the more judicious it is to retain this level as a distinct exposure level.

Each level extracted by the step thus described receives a given dose which can be exposed in a single pass. In FIG. 6b, the fine lines are eRIFs generated automatically by virtue of the invention in contradistinction to the prior art.

It is thereafter possible to carry out the fracturation step consisting in splitting the vector images into elementary shapes (right-angled triangles and rectangles) of size suited to the method and which will be exposed by the VSB tool. This fracturation method is well known to the person skilled in the art of electron lithography.

Advantageously, a design-specific aid can be integrated into the tools at the operator's disposal.

The geometric correction assumes an action of the operator which, as a function of his know-how and of the results of the exposures already made conceives of automatic modifications (shortening/lengthening of lines, etc.) which must be applied to all or part of the circuit.

To aid this operator when the modifications are not trivial and when manual intervention is still necessary, a tool implementing the method described can be implemented in its template application: a window, opened at his request, displays an optimal solution. The operator can then choose to generalize to patterns having the same characteristics the correction rules that he observes in this window, thus creating a library of correction rules reusable for similar patterns using for example automatic shape recognition algorithms.

Figure 7:
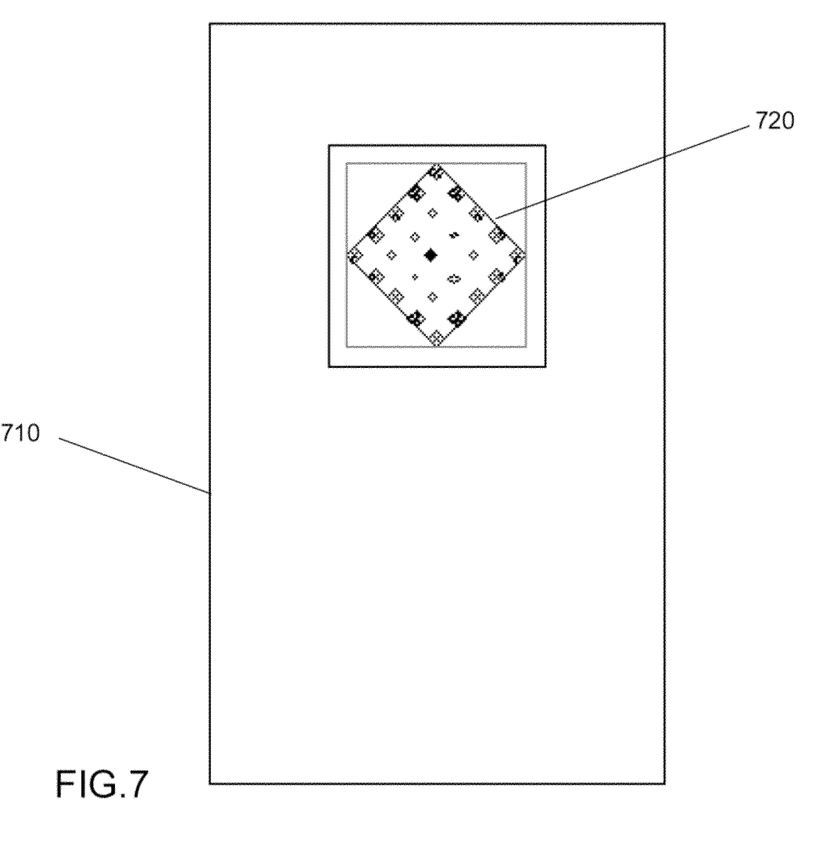
FIG. 7 illustrates a stencil comprising various openings for carrying out one or more irradiations in an embodiment of the invention using cell projection.

FIG. 7 illustrates a stencil comprising various openings for carrying out one or more irradiations in an embodiment of the invention using a cell projection illustrates a stencil comprising various openings for carrying out one or more irradiations in an embodiment of the invention using a cell projection.

In standard projection electron lithography, to irradiate a cell of the template, which corresponds to a set of patterns to be exposed, use is made of a stencil 710 which is a metal plate in which "holes" are formed. These holes can be considered to be printing characters. Each character is a set of elementary shapes (triangles, rectangles). The characters are grouped together into a character cell 720 whose geometry corresponds substantially to that of the template cell to be produced (geometric corrections are nonetheless possible). Several character cells 720 can be produced on the same stencil to produce various template cells. As a general rule, the geometries of these character cells will differ.

In the embodiments of the invention by multi-pass cells projection, it is proposed to use several character cells each corresponding to an exposure level to produce a cell of the template. Advantageously, these character cells are embedded on the same stencil (or "character plate"), the changing of a stencil being a lengthy and meticulous operation, the occurrences of which it is desired to minimize.

Figure 8A:
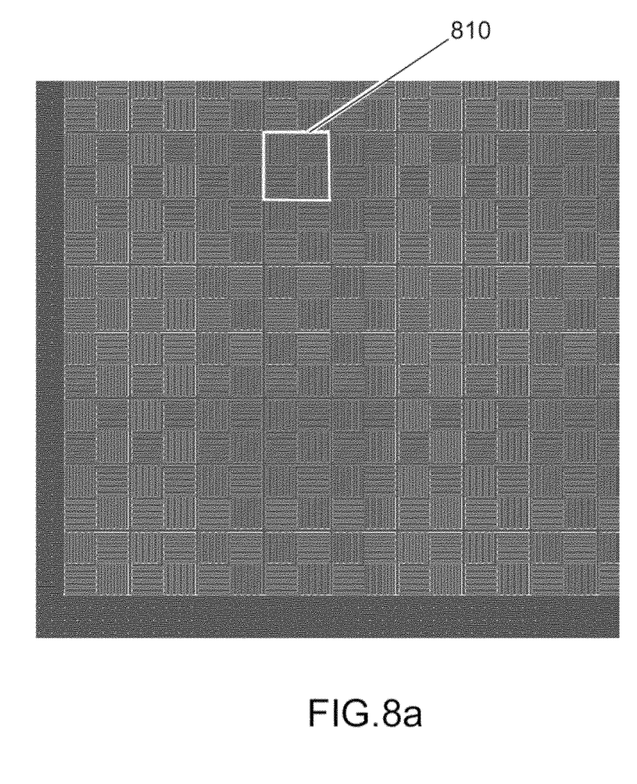
FIGS. 8b and 8a represent respectively a character cell of a stencil of the prior art and the cells of the template that it is sought to irradiate by a method using projection of cells corresponding to this character cell.
Figure 8B:
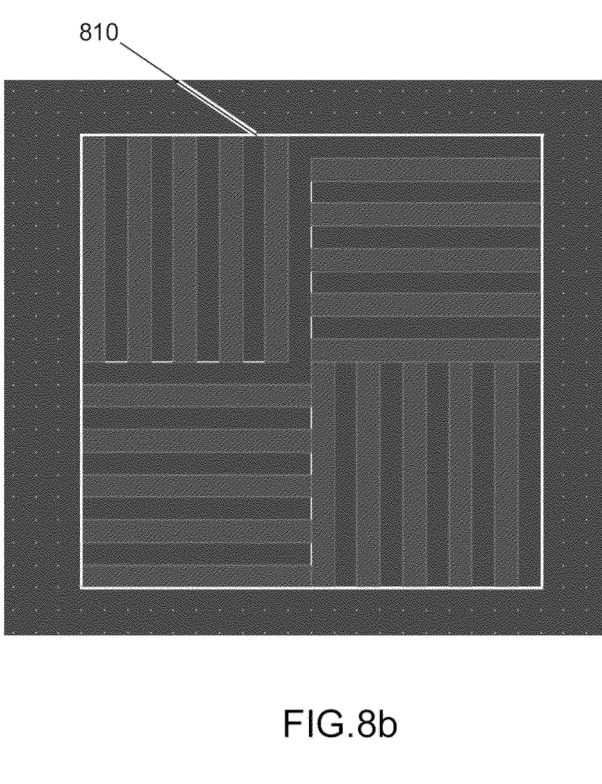

FIGS. 8b and 8a represent respectively a character cell of a stencil of the prior art and the cells of the template that it is sought to irradiate by a method using projection of cells corresponding to this character cell.

The stencil of FIG. 8b is used to irradiate the very repetitive template of FIG. 8a. The single pattern 810 of FIG. 8b replaces the hundred or so shots which would have been necessary to irradiate the same pattern by beam-formed lithography. The writing time when using the stencil is therefore divided accordingly. However, the precision of the irradiation is worse, notably because the backward scattering effect means that the parts of the design at the boundary of the zone 810 receive a lower dose than the parts of the design situated at the center of the zone.

In the standard cell projection lithography technique, it is not possible to carry out a dose modulation within the cell of the template. The dose modulation is performed from one irradiation to another, i.e. from one cell of the template to another. That is to say that in practice the cell will be irradiated for a longer or shorter time depending on whether it is situated at the edge of an exposed zone or in the core. But at each exposure, the character cell will allow through the same surface dose. The character cell is determined after observation of the template of the circuit, so as to factorize as large a zone as possible. A geometric correction may optionally occur beforehand.

An advantageous procedure making it possible to carry out jointly an inter-cell dose modulation and a geometric correction (addition of patterns to the edge, to the interior or to the exterior, in an adjoining or non-adjoining manner) has been described in international application No. PCT/EP2011/055861 filed by one of the proprietors of the present application. In the method disclosed by this application, advantageously the dosing is uniform for all the cells situated at the center of the block to be irradiated, the cells situated on the edge of the block receiving a higher dose computed by a functional relation involving the energy latitude of the method.

However, the forward scattering effect, which dominates at short distance and affects the precision of reproduction of the complex patterns that it could be advantageous to process by projection of cells, may not be corrected easily by these prior techniques.

In these embodiments of the invention, the cell of the template 810 is split for example into two levels. To decide the splitting into levels, it is for example advantageously possible to produce a histogram of the values taken by the pixels: the more populated a brightness level (i.e. the higher the number of pixels corresponding to this level), the more judicious it is to retain this level as a distinct exposure level. Each level extracted by the step thus described receives a given dose which can be exposed in a single pass.

The computation of the dose specific to each level can be performed by an extension of the dose modulation for an image to be exposed to a single level, the number N of levels constituting the number of parameters of the computation. For each exposure level, a different character cell (with different openings) is used and a specific dose is applied through each character cell.

According to the invention, the correction of the effects of intra-cell proximity is carried out by applying at one and the same time a dose modulation and geometric corrections according to the method set forth above.

In the case of this embodiment, the single gray-levels image output by the deconvolution is thereafter analyzed so as if appropriate to be split up into character cells intended to be exposed in several levels.

Figure 10A:
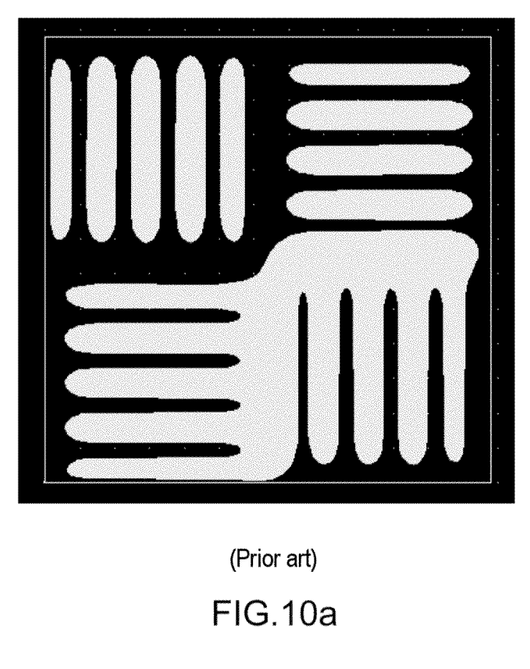
FIGS. 10a and 10b represent respectively the template cell obtained after irradiation through the character cell of FIG. 8b and that obtained after irradiation through the two character cells of FIGS. 9a and 9b, according to an embodiment of the invention.
Figure 10B:
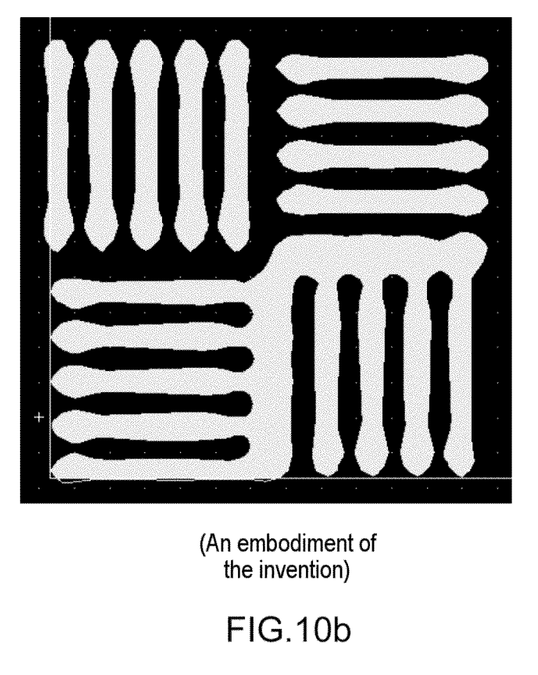

FIGS. 10a and 10b represent respectively the two character cells determined to expose the source pattern of FIG. 8b, according to an embodiment of the invention.

Figure 9A:
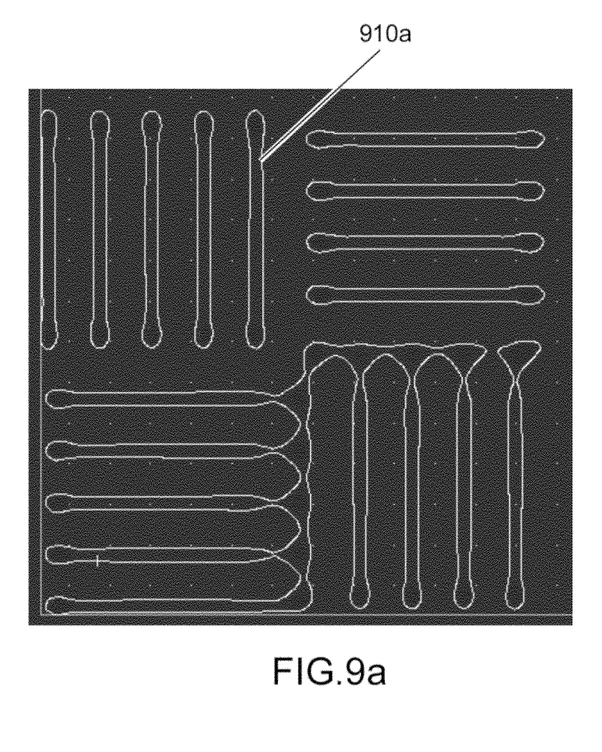
FIGS. 9a and 9b represent respectively the two character cells determined to expose the source pattern of FIG. 8b, according to an embodiment of the invention.
Figure 9B:
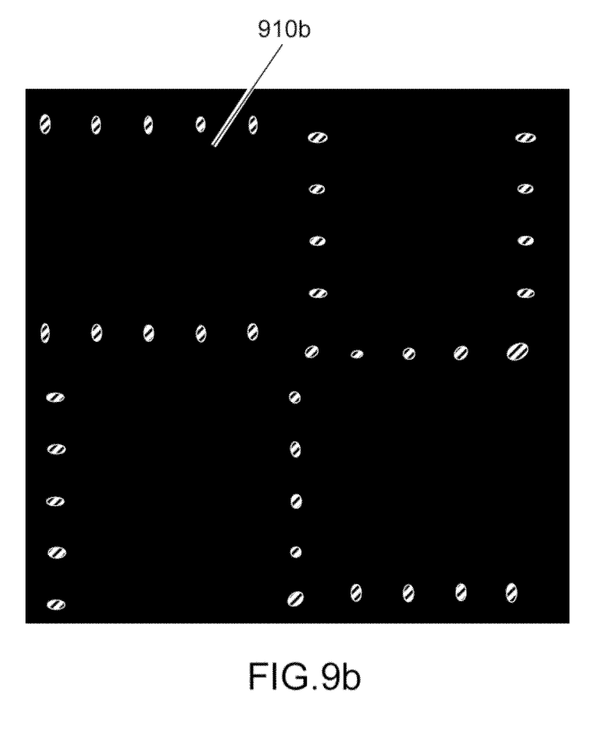

By way of example of the method of splitting into levels, to expose the pattern of FIG. 8b, the main design 910a of FIG. 9a is exposed on a $1^{st}$ level with a $1^{st}$ dose. In FIG. 9b, elements 910b are exposed on a $2^{nd}$ level with a $2^{nd}$ dose. These patterns are processed as are eRIFs in a standard method. Thus, the base pattern is reconstructed by superposition of the two separately exposed levels.

In the example illustrated by FIGS. 9a and 9b, the characteristic dimension of the lines and spaces of FIG. 10a is 32 nm.

Advantageously, the pattern of FIG. 8b is firstly deconvolved by a procedure of the type of those explained hereinabove as a commentary to FIGS. 8a and 8b.

FIGS. 10a and 10b represent respectively the template cell obtained after irradiation through the character cell of FIG. 8b and that obtained after irradiation through the two character cells of FIGS. 9a and 9b, according to an embodiment of the invention.

It is observed, by comparing the two figures, that in FIG. 10a which represents a case of the prior art, neither the widths of lines, nor the ends of lines are controlled. In FIG. 10b which represents the application of the invention in an embodiment with two exposure levels, the widths and the ends of lines conform to the template to be reproduced.

Figure 11A:
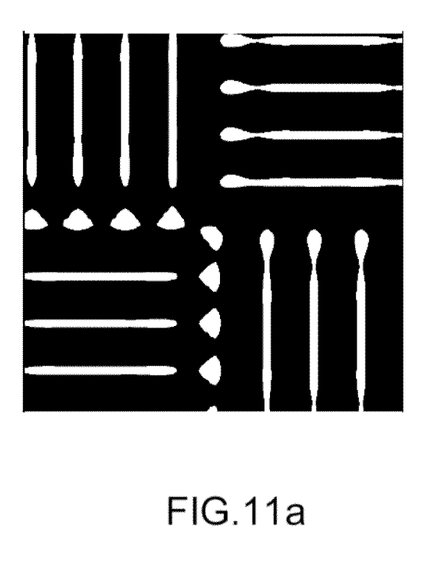
FIGS. 11a, 11b and 11c represent respectively three different exposure levels carried out with three character cells according to an embodiment of the invention.
Figure 11B:
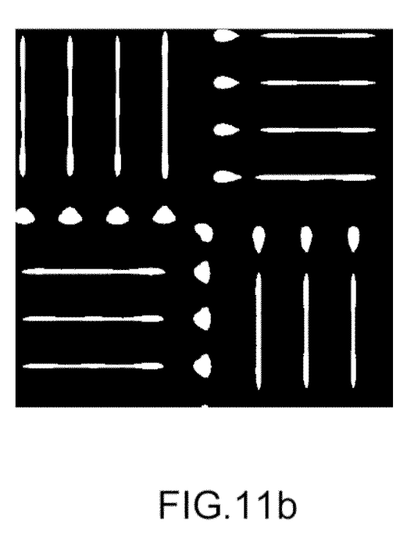
Figure 11C:
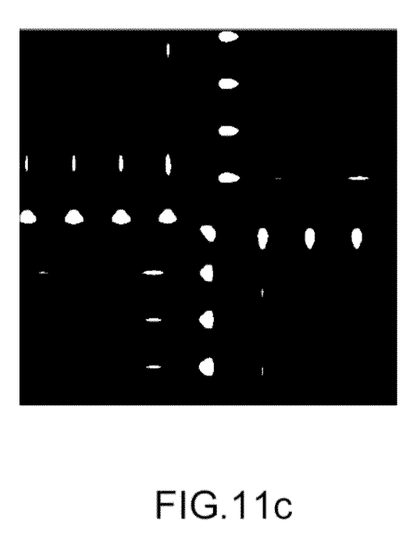

FIGS. 11a, 11b and 11c represent respectively three different exposure levels produced with three character cells according to an embodiment of the invention.

It is possible to split the pattern of FIG. 8b into more than two character cells, each corresponding to a different exposure level. In this case, intermediate patterns are created.

The three FIGS. 11a, 11b and 11c represent a selection of three out of ten exposure levels, said levels being determined by applying a selection procedure based on examining the brightness levels corresponding to a maximum of pixels.

These embodiments of the invention can be implemented with a machine and stencils of the prior art, for example a Vistec SB3050 Series machine with the "cell projection" option. The only modifications to be made to implement the invention consist of modifications of a software nature making it possible to carry out the splitting of the blocks to be irradiated into subsets intended to be exposed in distinct levels. If a deconvolution according to one of the advantageous modes set forth in the present description is implemented, these modifications will be completed by one or more complementary modules provided for this purpose.

The examples described hereinabove are given by way of illustration of certain embodiments of the invention. They do not in any way limit the field of the invention, defined by the claims which follow.

The invention claimed is:

1. A method of lithography by radiation of at least one pattern to be irradiated on a resined support comprising:
generating, using a computer processor, a chosen point spread function for said radiation, and
applying, using the computer processor, a chosen deconvolution procedure to said pattern to be irradiated by said point spread function,
wherein said point spread function is chosen so as to model only the effects of forward scattering of said radiation and said deconvolution procedure is chosen from among the procedures modeling the interactions of said radiation with the resined support by a joint probability distribution of said interactions, wherein the joint probability distribution of said interactions is associated with a maximum likelihood of each source point of said radiation for all the image points of the pattern to be irradiated as part of the interactions.

2. The method of lithography of claim 1, wherein said deconvolution procedure comprises computing the maximum likelihood of each source point of said radiation for all the image points of the pattern to be irradiated, each image point being multiplied by the value of the point spread function between the source point and the image point.

3. The method of lithography of claim 2, wherein said deconvolution procedure is a Lucy-Richardson procedure.

4. The method of lithography of claim 1, further comprising dithering the deconvolved image of the pattern to be irradiated.

5. The method of lithography of claim 1, further comprising splitting the deconvolved image into at least two distinct exposure levels.

6. The method of lithography of claim 5, wherein the at least two distinct exposure levels are chosen so as to maximize the population in terms of pixels of each of the levels.

7. The method of lithography of claim 5, further comprising vectorizing the deconvolved image of the pattern to be irradiated.

8. The method of lithography of claim 1, wherein the point spread function is a Gaussian.

9. The method of lithography of claim 8, wherein the mid-height width of the Gaussian is between 3 nm and 15 nm.

10. A computer program comprising program code instructions allowing, when the program is executed on a computer, the execution of the method of lithography by radiation of claim 1, said program comprising a function for generating a chosen point spread function for said radiation and a module for applying a chosen deconvolution procedure to the optionally filtered outputs of said radiation points spreading function applied to said pattern to be irradiated, wherein said point spread function is chosen so as to model only the effects of forward scattering of said radiation and said deconvolution procedure is chosen from among the procedures modeling the interactions of the points of said radiation by a joint probability distribution of said interactions.

11. The computer program of claim 10, further comprising an interface window in which an operator can program the application to at least one second pattern belonging to a determined class of correction rules determined by deconvolution of a first pattern belonging to said class.

* * * * *